United States Patent
McMonagle

(10) Patent No.: US 7,862,859 B2
(45) Date of Patent: Jan. 4, 2011

(54) METHOD OF CORRECTING FOR PATTERN RUN OUT

(75) Inventor: Jason McMonagle, Darlington (GB)

(73) Assignee: RFMD (UK) Limited, Newton Aycliffe (GB)

( * ) Notice: Subject to any disclaimer, the term of this patent is extended or adjusted under 35 U.S.C. 154(b) by 886 days.

(21) Appl. No.: 11/756,870

(22) Filed: Jun. 1, 2007

(65) Prior Publication Data

US 2007/0281225 A1    Dec. 6, 2007

(30) Foreign Application Priority Data

Jun. 1, 2006  (GB)  ................................. 0610806.2

(51) Int. Cl.
*B05D 1/32*    (2006.01)
*G01N 1/28*    (2006.01)
*C23C 16/52*   (2006.01)
*C08J 7/04*    (2006.01)

(52) U.S. Cl. ........................ 427/282; 427/272; 427/468; 427/510; 427/2.11; 427/8; 216/12; 216/41; 216/45; 216/46; 216/47; 216/48; 216/49; 216/50; 216/51; 438/942; 438/975

(58) Field of Classification Search ................ 427/2.11, 427/8, 272, 282, 468, 510; 216/12, 41, 45–51; 438/942, 975

See application file for complete search history.

(56) References Cited

U.S. PATENT DOCUMENTS 4,347,001 A    8/1982  Levy et al.
(Continued)

FOREIGN PATENT DOCUMENTS

JP    6208942    7/1994
(Continued)

OTHER PUBLICATIONS

Search Report for U.S. Appl. No. 11/756,870, filed Jun. 1, 2007.

*Primary Examiner*—Timothy H Meeks
*Assistant Examiner*—Mandy C Louie

(74) *Attorney, Agent, or Firm*—Withrow & Terranova, P.L.L.C.

(57) ABSTRACT

A method of correcting for pattern run out in a desired pattern in directional deposition or etching comprising the steps of
 providing a test substrate;
 providing a stencil of known thickness on the test substrate;
 providing a stencil pattern extending through the stencil to the test substrate.
 exposing the test substrate through the stencil to a source of directional deposition or etching;
 comparing the stencil pattern to the pattern on the substrate at a plurality of points along at least one direction to determine pattern run out at said points;
 fitting the measured pattern run out as a function of position to a function of the form $$\Delta X = MX + C$$

where $\Delta X$=pattern run out, X=position on the substrate, M=Magnification and C=translational offset;
 providing a further substrate at a known position relative to the first;
 providing a further stencil of known thickness;
 adjusting the magnification to allow for the difference in stencil thickness between the test stencil and the further stencil;
 adjusting the transitional offset to allow for the difference in position of the test substrate and further substrate along said direction;
 providing a desired pattern to be deposited or etched on the further substrate;
 correcting each point of the desired pattern by the inverse of the determined pattern run out at the point;
 providing the corrected desired pattern on this further stencil, the pattern extending through the further stencil to the substrate;
 exposing the further substrate through the further stencil to the directional source of deposition or etching.

15 Claims, 7 Drawing Sheets

U.S. PATENT DOCUMENTS 4,776,868 A * 10/1988 Trotter et al. .............. 65/17.4
6,168,832 B1 * 1/2001 Boucher ................ 427/248.1
6,867,109 B2 * 3/2005 Hong et al. .............. 438/401

FOREIGN PATENT DOCUMENTS

JP          9275062          10/1997

* cited by examiner

METHOD OF CORRECTING FOR PATTERN RUN OUT

CROSS-REFERENCE TO RELATED APPLICATIONS

The subject patent application claims priority to and all the benefits of United Kingdom Patent Application No. 0610806.2, which was filed on Jun. 1, 2006 with the UK Patent Office.

FIELD OF THE INVENTION

The present invention relates to a method of correcting for pattern run out in a desired pattern in directional deposition or etching.

BACKGROUND OF THE INVENTION

It is known to produce patterns on a substrate by exposing the substrate to a source of directional deposition or etching through a pattern in a stencil. Typically (although not essentially) the substrate is arranged such that a normal to the substrate passes through the directional source. For the portion of the substrate close to this normal the pattern produced on the substrate is substantially the pattern of the stencil. As one moves away from this normal however the source appears to be inclined to the substrate. The thickness of the stencil results in stencil shadowing with the pattern on the substrate being slightly displaced from the corresponding portion of the pattern of the stencil This 'pattern run out' limits the accuracy with which patterns can be deposited or etched onto a substrate. This pattern run out is also referred to as pattern registration (overlay).

The method according to the present invention seeks to overcome this problem.

SUMMARY OF THE INVENTION

Accordingly, in a first aspect of the present invention provides a method of correcting for pattern run out in a desired pattern in directional deposition or etching comprising the steps of providing a test substrate;

providing a stencil of known thickness on the test substrate;

providing a stencil pattern extending through the stencil to the test substrate.

exposing the test substrate through the stencil to a source of directional deposition or etching;

comparing the stencil pattern to the pattern on the substrate at a plurality of points along at least one direction to determine pattern run out at said points;

fitting the measured pattern run out as a function of position to a function of the form $$\Delta X = MX + C$$

where $\Delta X$=pattern run out, $X$=position on the substrate, $M$=Magnification and $C$=translational offset;

providing a further substrate at a known position relative to the first;

providing a further stencil of known thickness;

adjusting the magnification to allow for the difference in stencil thickness between the test stencil and the further stencil;

adjusting the translation offset to allow for the difference in position of the test substrate and further substrate along said direction;

providing a desired pattern to be deposited or etched on the further substrate;

correcting each point of the desired pattern by the inverse of the determined pattern run out at that point;

providing the corrected desired pattern on this further stencil, the pattern extending through the further stencil to the substrate;

exposing the further substrate through the further stencil to the directional source of deposition or etching.

By providing a corrected desired pattern on the stencil one can produce the true desired pattern on the substrate even remote from the normal to the directional source.

Preferably, the source of directional deposition or etching is a source of directional deposition.

Alternatively, the source of directional deposition or etching is a source of etching.

The source can be a point source.

Preferably, the pattern run out is measured as a function of two orthogonal directions on the test substrate.

Preferably, the magnification is adjusted by multiplying the magnification by the ratio of the thickness of the further stencil to the thickness of the test stencil.

Preferably, the translational offset is adjusted by multiplying the translational offset by the ratio of the distances of the test substrate and further substrate from the point perpendicularly below the source in the plane of the substrates.

The corrected desired pattern can be provided on the stencil by a global printing technique, preferably contact printing.

The desired pattern can comprise a repeating pattern of unit cells and wherein the corrected desired pattern is provided on the stencil by a step and repeat or step and scan system.

Preferably, the distance between steps in the step and repeat or step and scan system is reduced from the distance between unit cells by the determined pattern run out over the distance between unit cells.

The step and repeat or step and scan system uses a corrected unit cell being the unit cell corrected for determined pattern run out.

BRIEF DESCRIPTION OF THE DRAWINGS

The present invention will now be described by way of example only and not in any limitative sense with reference to the accompanying drawings in which.

DETAILED DESCRIPTION OF THE INVENTION

Figure 1:
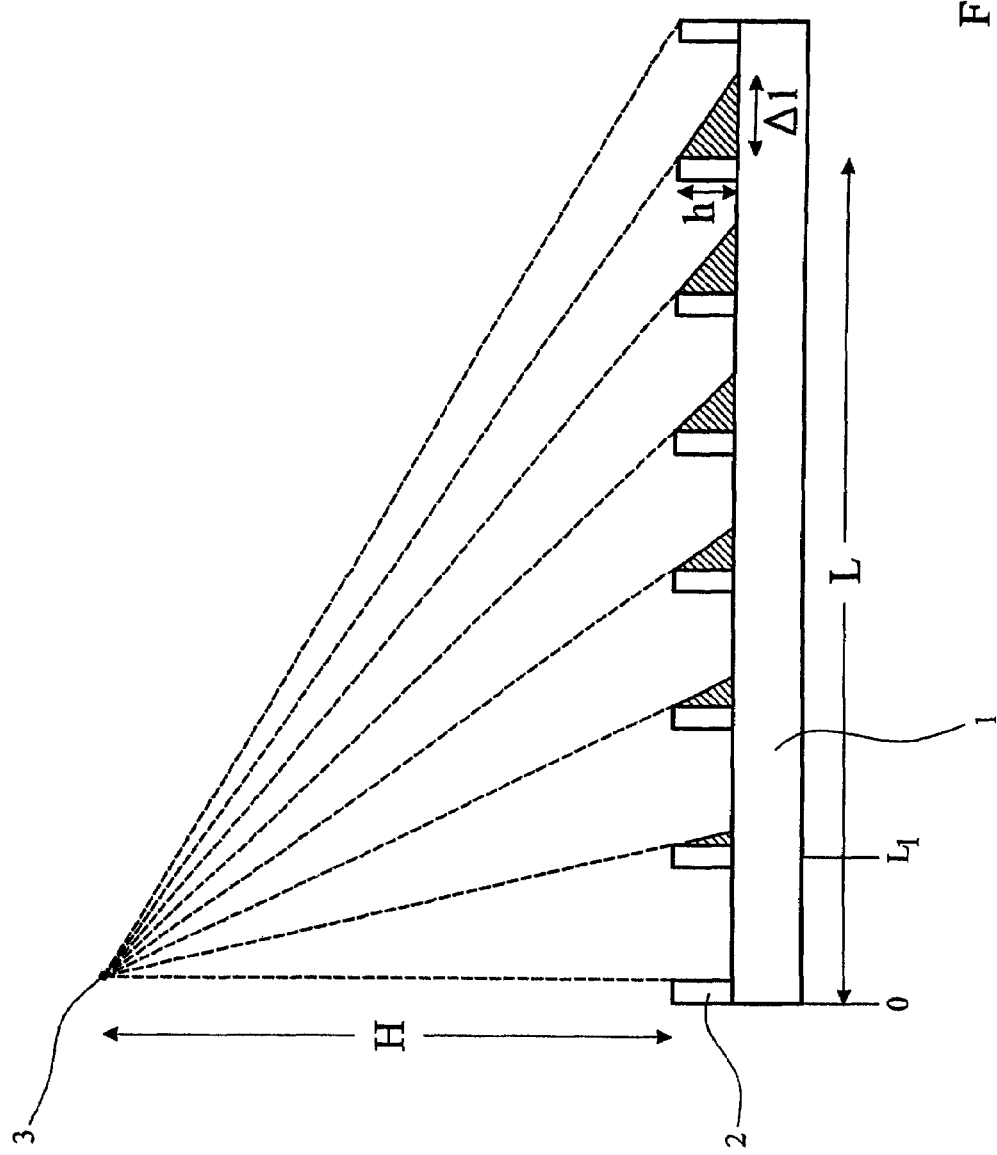
FIG. 1 shows in a schematic form the problem of pattern run out in directional deposition or etching.

FIG. 1 shows a substrate 1 having a stencil 2. A pattern extends through the stencil 2 to the substrate 1. Above the substrate 1 is a directional source of deposition 3.

For the substrate 1 directly beneath the source 3, the thickness of the stencil 2 has little or no effect on the pattern deposited by the directional source 3 on the substrate 1. However, as one moves away from this point O directly beneath the source 3 the stencil 2 shadows the direct line of sight from the source 3 to the substrate 1. This displaces the pattern deposited on the substrate 1 with respect to the pattern of the stencil 2 as shown. This pattern run out limits the accuracy with which patterns can be deposited on the substrate 1 through stencil 2.

For the simple ideal system shown in FIG. 1 the pattern run out ΔX is related to the distance X from the point O underneath the source 3 by the relation $$\Delta X = \frac{hX}{H}$$

where h is the stencil thickness and H is the perpendicular distance of the source 3 above the substrate 1. More generally, if the substrate does not extend from the point O directly beneath the source 3 but from the point $L_1$ then $$\Delta X = \frac{h}{H}(X - L_1) + \frac{hL_1}{H}$$

$(X-L_1)$ is the position on the substrate in the co-ordinates of the substrate 1, rather than measured from the position directly under the source 3.

The factor h/H is referred to as the magnification and as can be seen is proportional to stencil thickness. $hL_1/H$ is related to the translational offset of the substrate 1 from the point beneath the source 3. It is also proportional to stencil thickness.

In practice the situation is more complex. For example the source 3 may not be a true point source and the stencil thickness may not be uniform or may not be known accurately. Accordingly, if one wishes to determine run out accurately it must be done by measurement.

Figure 2:
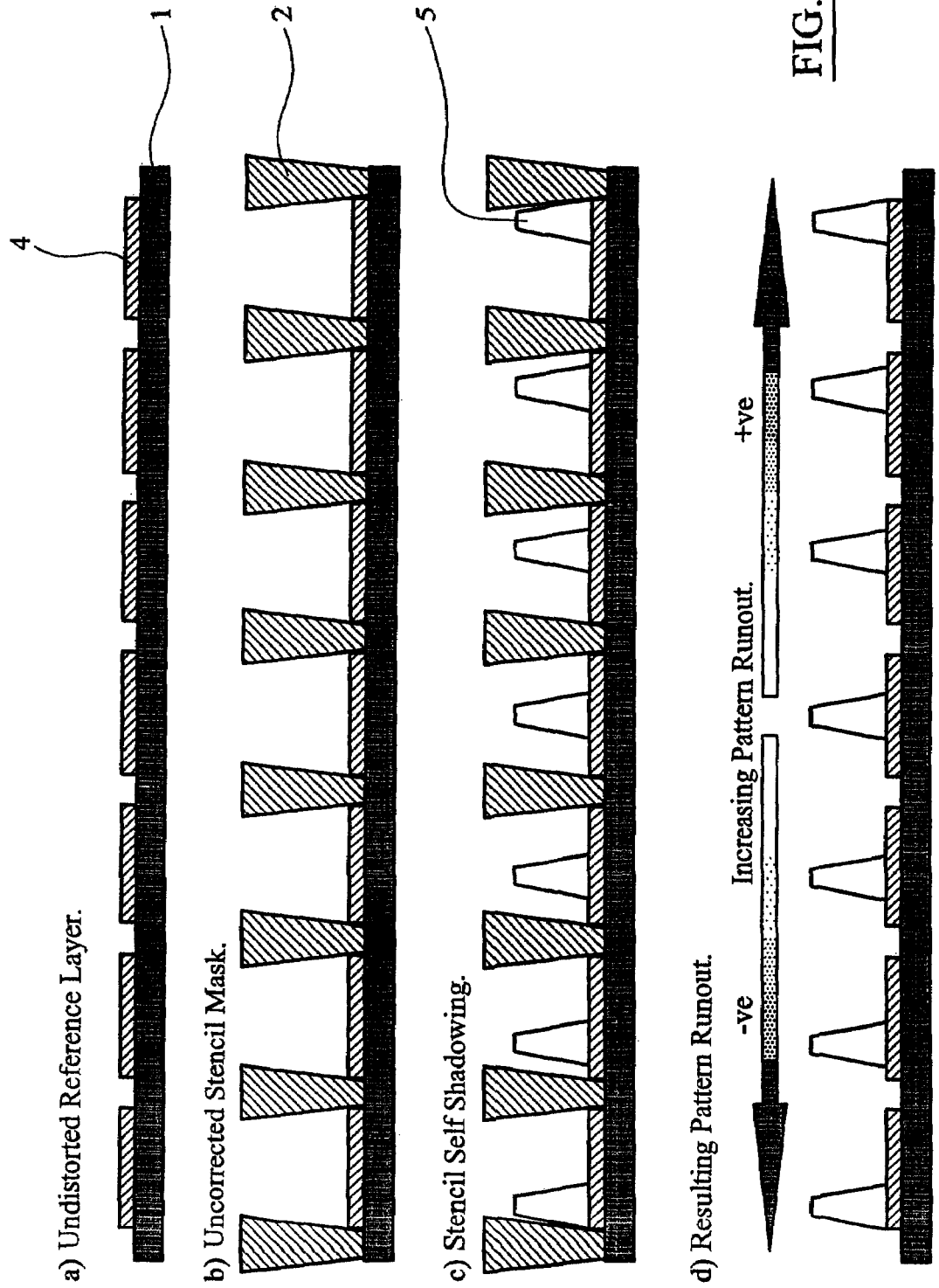
FIG. 2 shows a method of measuring pattern run out as a function of position on a substrate.

Shown in FIG. 2 in schematic form is a method of measuring pattern run out. Firstly, a substrate 1 is provided having on it a undistorted reference layer 4. A stencil 2 is provided on the substrate 1. The stencil 2 is arranged such that the pattern in the stencil 2 is aligned with a pattern on the undistorted reference layer 4 on the substrate 1. The substrate 1 and stencil 2 are exposed to the directional source (not shown) and then the stencil 2 removed.

Each element 5 of the deposited pattern is compared with an associated reference mark in the pattern on the undistorted reference layer 4. Without pattern run out the two should be aligned. Due to pattern run out each element 5 of the deposited pattern is slightly displaced compared to its associated reference mark. By measuring the displacement of each deposited element 5 with respect to its associated reference mark pattern run out as a function of position across the substrate 1 can be determined. This is typically done by machine.

Figure 3:
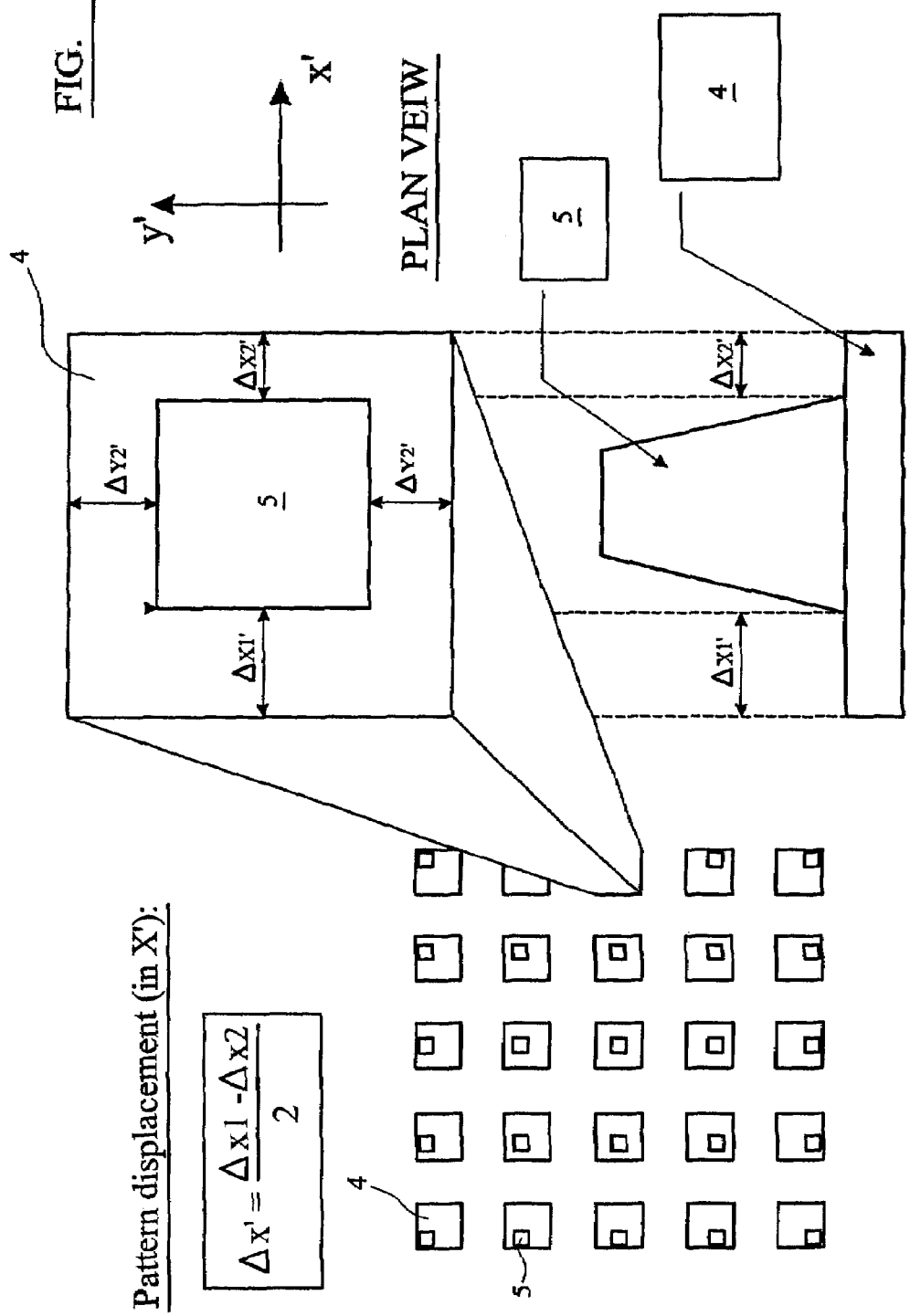
FIG. 3 shows FIG. 2 in plan view.

FIG. 3 shows the method of FIG. 2 in plan view. The undistorted reference pattern on the substrate 1 is a series of equally spaced squares. The pattern on the stencil 2 is also a series of squares aligned with the squares of the reference pattern. As can be seen due to pattern run out the elements 5 of the deposited pattern are only aligned with the reference pattern directly beneath the deposition source 3. As ones moves away from this point the two patterns become misaligned. As shown this misalignment is measured by measuring the distance between the elements 5 of the deposited pattern and the edges of the surrounding reference square. A pattern of square as a reference pattern is referred to as a 'box in box' alignment feature. Other methods of measuring the pattern run out are of course possible.

Figure 4:
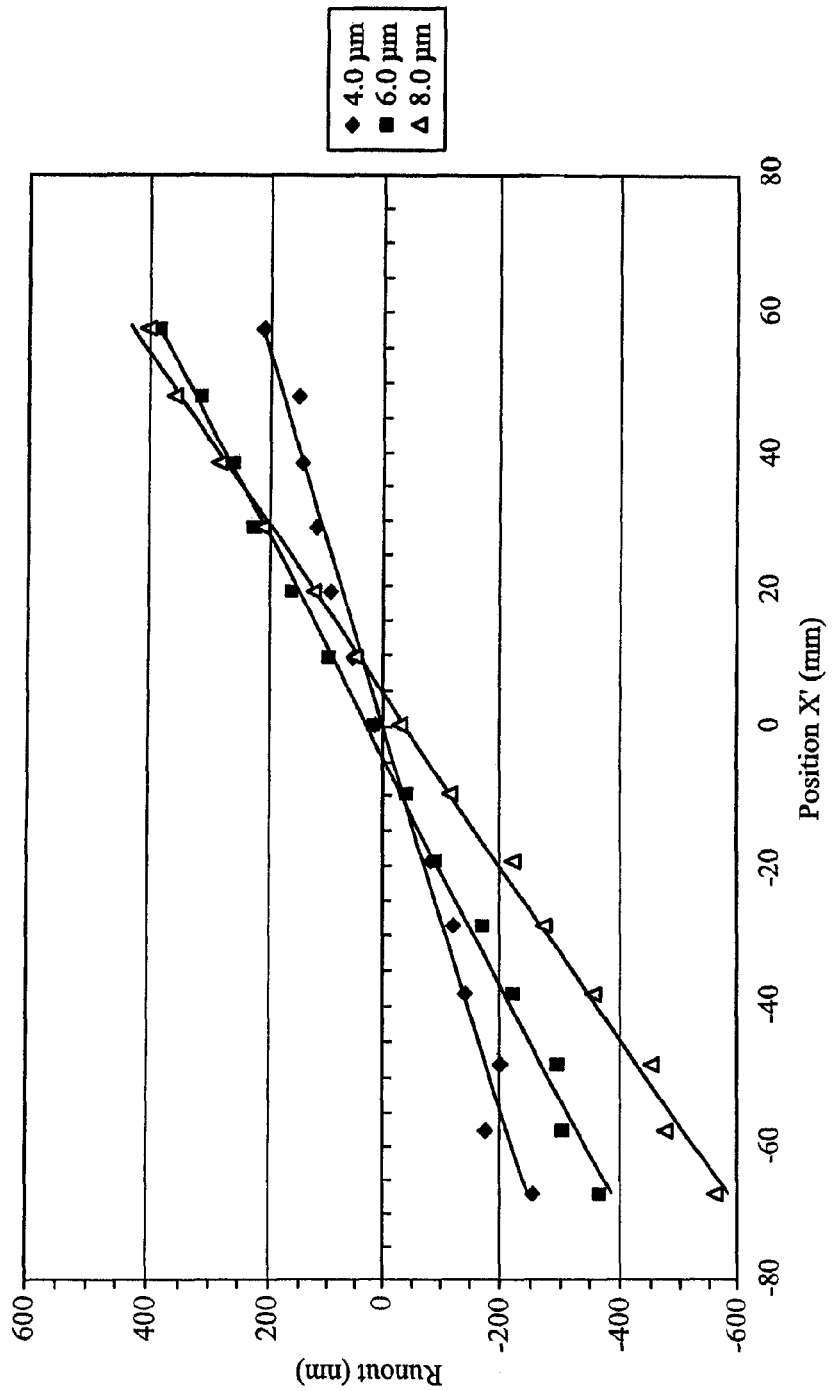
FIG. 4 shows measured pattern run out as a function of position on a substrate for different stencil heights.

FIG. 4 shows measured pattern run out as a function of position on the substrate 1. To first order the measured run out fits the expected linear form. Measured run out is shown for three different stencil thickness. As expected, the slope of the line fitted to the measured run out points increases proportional to stencil thickness.

Figure 5:
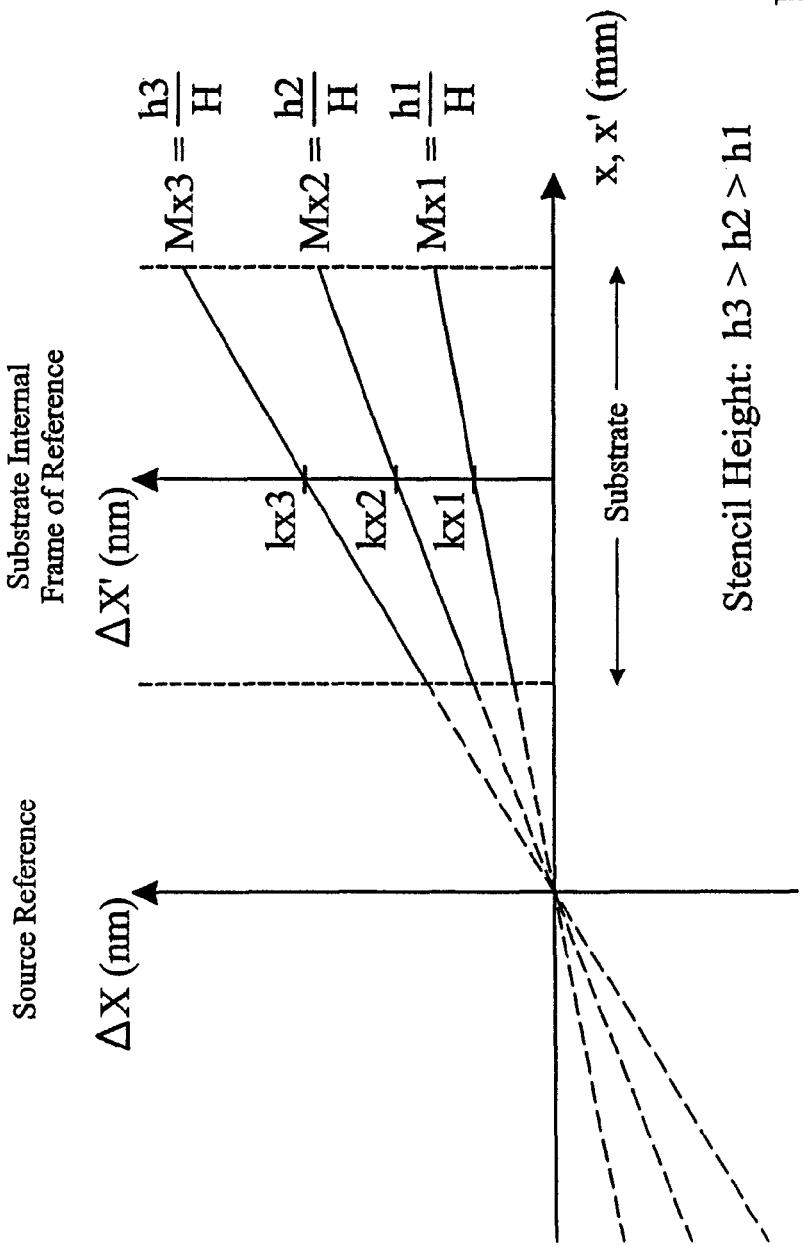
FIG. 5 shows a theoretical plot pattern run out as a function of position on a substrate.

FIG. 5 shows an expected plot of pattern run out as a function of position for a substrate 1 which is not positioned directly beneath the source 3. Pattern run out is still a linear function of position on the substrate 2 only now with a different intercept.

The method of the invention is a method of correcting for such pattern run out. Accordingly to the method a test substrate 1 is provided. On the upper face of the test substrate 1 is a reference layer 4 having undistorted reference pattern. A stencil 2 is provided on the upper face having a patter aligned with the reference pattern. The substrate 1 is then exposed to the directional source of deposition 3 so depositing a pattern through the pattern in the stencil 2 onto the substrate 1. The stencil 2 is then removed and the deposited pattern compared to the reference pattern to determine the pattern run out as a function of position on the substrate 1 at a plurality of points. Pattern run out is measured along two orthogonal directions so as to cover the entire substrate 1. The measured pattern run out in each direction is fitted to a straight line to determine the pattern run out at every point on the substrate 1. From this one determines the magnification and offset in each direction.

A further substrate 6 is then provided on which one wishes to deposit a desired pattern. A stencil 7 is provided on the substrate. The desired pattern is corrected by displacing each part of the desired pattern by the inverse of the determined pattern run out at that point. The corrected desired pattern is then provided on the stencil 7, extending through the stencil 7 to the substrate 6. The substrate 6 is then exposed to the source 3 for deposition through the stencil 7 so depositing a pattern. Finally, the stencil 7 is removed. As the pattern extending through the stencil was corrected for pattern run out the pattern deposited on the substrate 6 is then desired pattern with no pattern run out.

Figure 6:
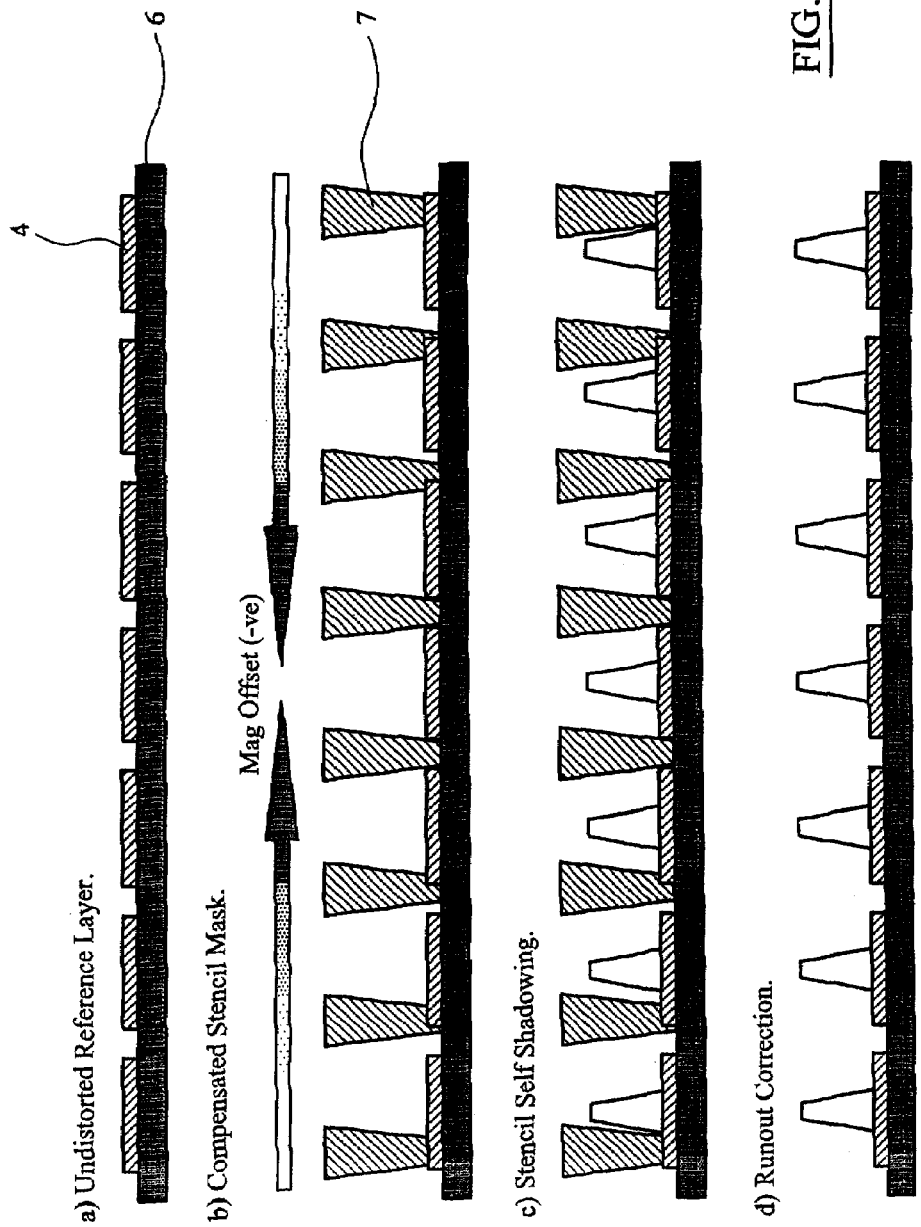
FIG. 6 shows the method according to the invention.

The method is shown in schematic form in FIG. 6. The pattern run out caused by deposition of the pattern through a stencil 2 is first measured at a plurality of points by the method o FIG. 2 and 3. It is then determined as a function of position on the substrate 1 by fitting the measured points to a straight line. The slope of the straight line is the magnification. The intercept is the translation offset. An identical test substrate 6 is provided having an undistorted reference layer 4. A stencil 7 of the same thickness as the original stencil 2 is provided on the substrate 6. The test pattern is then corrected by the inverse of the pattern run out at each point before being provided on the stencil 7. Again the pattern extends through the stencil 7 to the test substrate 6. Finally, the test substrate 6 is exposed to the same directional source to deposit a pattern and the test substrate 6 removed. As can be seen the deposited pattern is aligned with the reference pattern on the substrate 6 across the substrate.

Figure 7:
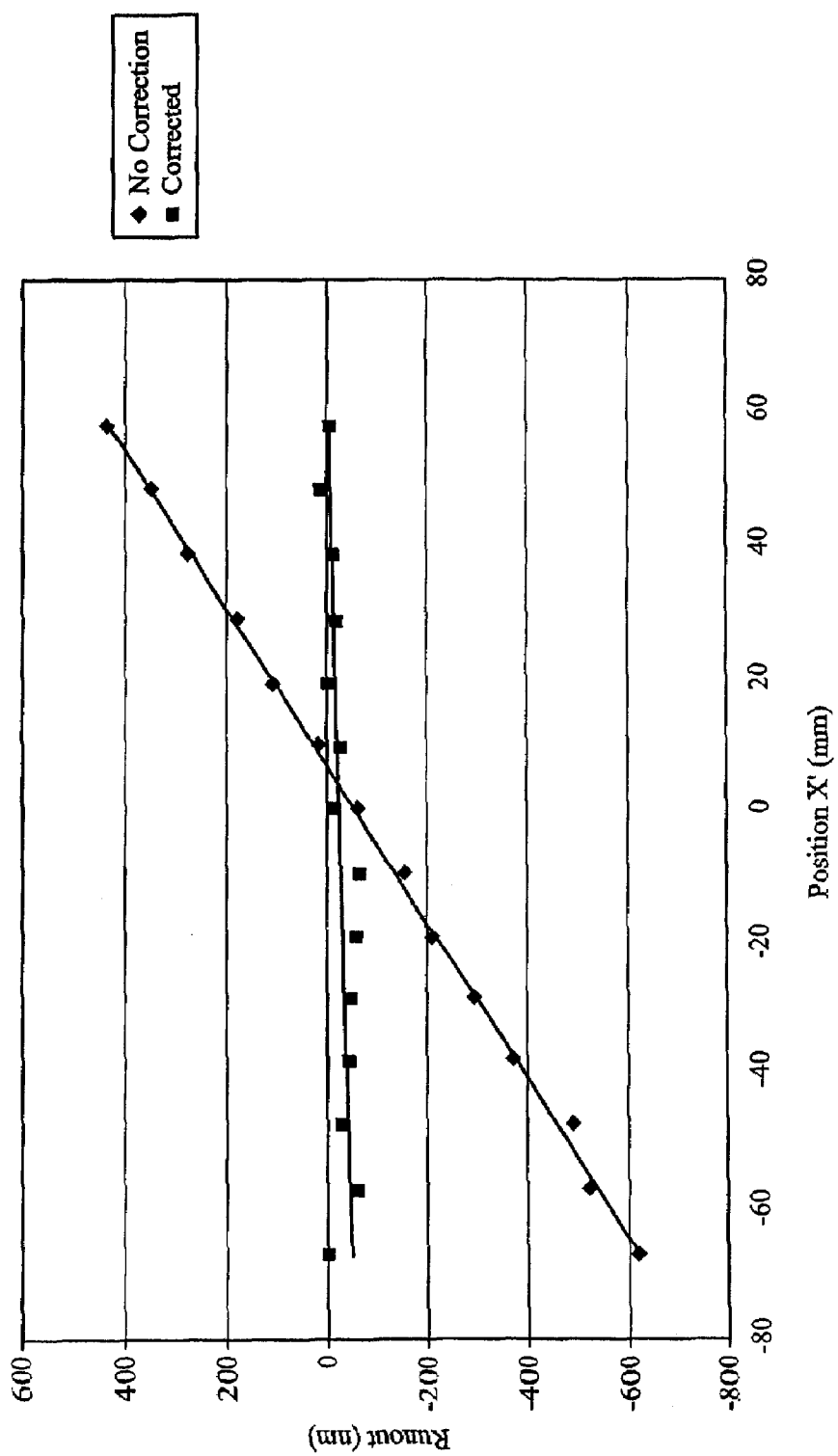
FIG. 7 shows measured pattern run out as a function of position on the substrate for a pattern laid down with and without correction for run out.

Shown in FIG. 7 is measured pattern run out as a function of position across the substrate 1 for patterns deposited both with and without pattern correction for pattern run out.

Once one knows the magnification and offset for one particular position of substrate 1 and thickness of stencil 2 it is a simple matter to determine the pattern run out as a function of position for other substrates 1. In another aspect of the invention a first test substrate 1 is provided at distance $L_1$ from the point perpendicularly beneath the source 3 and the magnification and offset of a pattern deposited through a stencil 2 determined as before. The second substrate 6 is then provided in a known position $L_2$. A stencil 7 with a different thickness is provided on the substrate 6. The value of the magnification is then altered to allow for the new stencil thickness. As magnification is proportional to stencil thickness this is done by multiplying the determined magnification by the ratio of the thickness of the new stencil 7 to the thickness of the old stencil 2. Next the value of the translational offset is also altered to allow for the difference in position of the first and second substrates 1,6. As can be seen from the above the offset is proportional to the thickness of stencil 2,7 and the same correction is made to the translational offset as to the magnification. In addition, the translational offset is also multiplied by the ratio of the distance $L_2$ for the second substrate 6 to $L_1$ for the first substrate 1. With these corrected values of magnification and offset one then has a function of pattern run out against position for the new substrate 6. This is then used to produce the corrected end pattern on the new substrate 6 as before.

In the methods of these embodiments pattern run out is measured along orthogonal directions on the substrate 1 and the pattern run out determined from these measurements by fitting the measurements to straight lines. In an alternative embodiment the source 3 is an extended collimated source so requiring measurement along one direction only. With a collimated source pattern run out is independent of position and so the magnification is zero. The offset is related to the angle of the incident rays to the plane of the substrate 1.

The above method has only been described with reference to a deposition source 3. Alternatively, the source 3 could be a source 3 for etching a pattern in the substrate 1.

There are a number of possible ways of providing the corrected desired pattern in the stencil 2. These generally fall into either global methods or step and repeat methods.

With a global method the entire pattern is provided on the stencil 2 in a single step. An example of such a method is contact printing. With such a method the correction for pattern run off is typically introduced at the mask level in the original layout software file or at mask manufacture.

Step and repeat methods are used when the desired pattern comprises a plurality of repeated unit cells. In one example of a step and repeat system a mask is provided comprising the pattern of the unit cell. The mask is then moved so as to repeatedly print the pattern of the unit cell on the stencil 2. An alternative is a step and scan type method where the pattern of the unit cell is written on the stencil 2 before displacing the writing tool by one unit cell and repeating.

The pattern run out is proportional to the distance along the substrate 1. One can correct the unit cell and then repeatedly print it on the substrate 1. As an additional refinement one can reduce the step length to slightly less than the unit cell length to allow for pattern run out over the length of the unit cell.

The invention claimed is:

1. A method of correcting for pattern run out in a desired pattern in directional deposition or etching comprising the steps of:
    providing a test substrate;
    providing a test stencil of known thickness on the test substrate;
    providing a stencil pattern extending through the test stencil to the test substrate;
    exposing the test substrate through the test stencil to a source of directional deposition or etching;
    comparing the stencil pattern to a pattern on the test substrate at a plurality of points along at least one direction to determine pattern run out at said points;
    fitting the measured pattern run out as a function of position to a function of the form $$\Delta X = MX + C$$

where $\Delta X$=pattern run out, X=position on the substrate, M=Magnification and C=translational offset;
    providing a further substrate at a known position relative to the test substrate;
    providing a further stencil of known thickness;
    adjusting the magnification to allow for the difference in stencil thickness between the test stencil and the further stencil;
    adjusting the translational offset to allow for the difference in position of the test substrate and the further substrate along said direction;
    providing a desired pattern to be deposited or etched on the further substrate;
    correcting each point of the desired pattern by the inverse of the determined pattern run out at that point;
    providing the corrected desired pattern on the further stencil, the pattern extending through the further stencil to the further substrate;
    exposing the further substrate through the further stencil to the directional source of deposition or etching.

2. A method as claimed in claim 1, wherein the source of directional deposition or etching is a source of directional deposition.

3. A method as claimed in claim 1, wherein the source of directional deposition or etching is a source of etching.

4. A method as claimed in claim 1, wherein the source is a point source.

5. A method as claimed in claim 1, wherein the pattern run out is measured as a function of two orthogonal directions on the test substrate.

6. A method as claimed in claim 1, wherein the magnification is adjusted by multiplying the magnification by the ratio of the thickness of the further stencil to the thickness of the test stencil.

7. A method as claimed in claim 6, wherein the translational offset is adjusted by multiplying the translational offset by the ratio of the distances of the test substrate and further substrate from the point perpendicularly below the source in the plane of the substrates.

8. A method as claimed in claim 1, wherein the corrected desired pattern is provided on the further stencil by a global printing technique.

9. A method as claimed in claim 1, wherein the desired pattern comprises a repeating pattern of unit cells and wherein the corrected desired pattern is provided on the further stencil by a step and repeat or step and scan system.

10. A method as claimed in claim 9, wherein the distance between steps in the step and repeat or step and scan system is reduced from the distance between unit cells by the determined pattern run out over the distance between unit cells.

11. A method as claimed in claim 10, wherein the step and repeat or step and scan system uses a corrected unit cell being the unit cell corrected for determined pattern run out.

12. A method as claimed in claim 2, wherein the source is a point source.

13. A method as claimed in claim 3, wherein the source is a point source.

14. A method as claimed in claim 1, wherein the translational offset is adjusted by multiplying the translational offset by the ratio of the distances of the test substrate and further substrate from the point perpendicularly below the source in the plane of the substrates.

15. A method as claimed in claim 1, wherein the corrected desired pattern is provided on the further stencil by contact printing.

* * * * *